United States Patent
Kimura et al.

(10) Patent No.: US 8,736,322 B2
(45) Date of Patent: May 27, 2014

(54) VOLTAGE CONTROLLED OSCILLATOR CALIBRATION

(75) Inventors: Koji Kimura, San Diego, CA (US); Alireza Zolfaghari, Laguna Niguel, CA (US)

(73) Assignee: Broadcom Corporation, Irvine, CA (US)

(*) Notice: Subject to any disclaimer, the term of this patent is extended or adjusted under 35 U.S.C. 154(b) by 160 days.

(21) Appl. No.: 13/298,057

(22) Filed: Nov. 16, 2011

(65) Prior Publication Data
US 2013/0120034 A1   May 16, 2013

(51) Int. Cl.
*H03L 7/00* (2006.01)

(52) U.S. Cl.
USPC .......................................... 327/155; 327/141

(58) Field of Classification Search
USPC ............. 327/155, 141–143; 331/1 A, 10, 44, 331/177 R, 167, 17 R, 11, 34
See application file for complete search history.

(56) References Cited

U.S. PATENT DOCUMENTS 7,746,182 B2 * 6/2010 Ramaswamy et al. .......... 331/44

* cited by examiner

*Primary Examiner* — Lincoln Donovan
*Assistant Examiner* — Diana J Cheng
(74) *Attorney, Agent, or Firm* — Oblon, Spivak, McClelland, Maier & Neustadt, L.L.P.

(57) ABSTRACT

A mobile communication device is provided that has a transceiver including a voltage controlled oscillator (VCO) and a calibration circuit for calibrating the VCO. The calibration circuit includes a logic block configured to estimate a calibration value for a tuning of the VCO to a desired frequency, and an asynchronous counter configured to execute a counting sequence to identify a frequency of the VCO after the tuning of the VCO using the calibration value, where the calibration circuit is configured to determine a tuned calibration value for producing the desired frequency from the counting sequence.

17 Claims, 5 Drawing Sheets

VOLTAGE CONTROLLED OSCILLATOR CALIBRATION

BACKGROUND

Voltage controlled oscillators (VCOs) are widely used in radio transceivers. When implemented to support radio transmission, for example, a VCO must typically be calibrated or "tuned" to an appropriate transmit frequency prior to commencement of a transmit cycle. As a result, in a mobile device radio utilizing a secure frequency hopping transmission protocol, such as spread-spectrum cellular communications, or shorter range Bluetooth communications, for example, VCO calibration may need to occur up to a thousand times per second, with each calibration sequence drawing some energy from the mobile device battery.

Although power conservation is important for substantially all battery powered mobile communication devices, it may be a particularly critical issue for personal area network (PAN) communication devices employing Bluetooth and the newer Bluetooth Low Energy (BLE) technologies, for example. Such devices typically rely on very small batteries to support short-range communications, and must keep their power overheads to a minimum. In order to meet the stringent power budgets of these newer communication devices while also enabling the advantageous data security provided by frequency hopping transmission protocols, solutions with a faster VCO calibration is needed.

SUMMARY

The present disclosure is directed to VCO calibration, substantially as shown in and/or described in connection with at least one of the figures, as set forth more completely in the claims.

DETAILED DESCRIPTION

Figure 1:
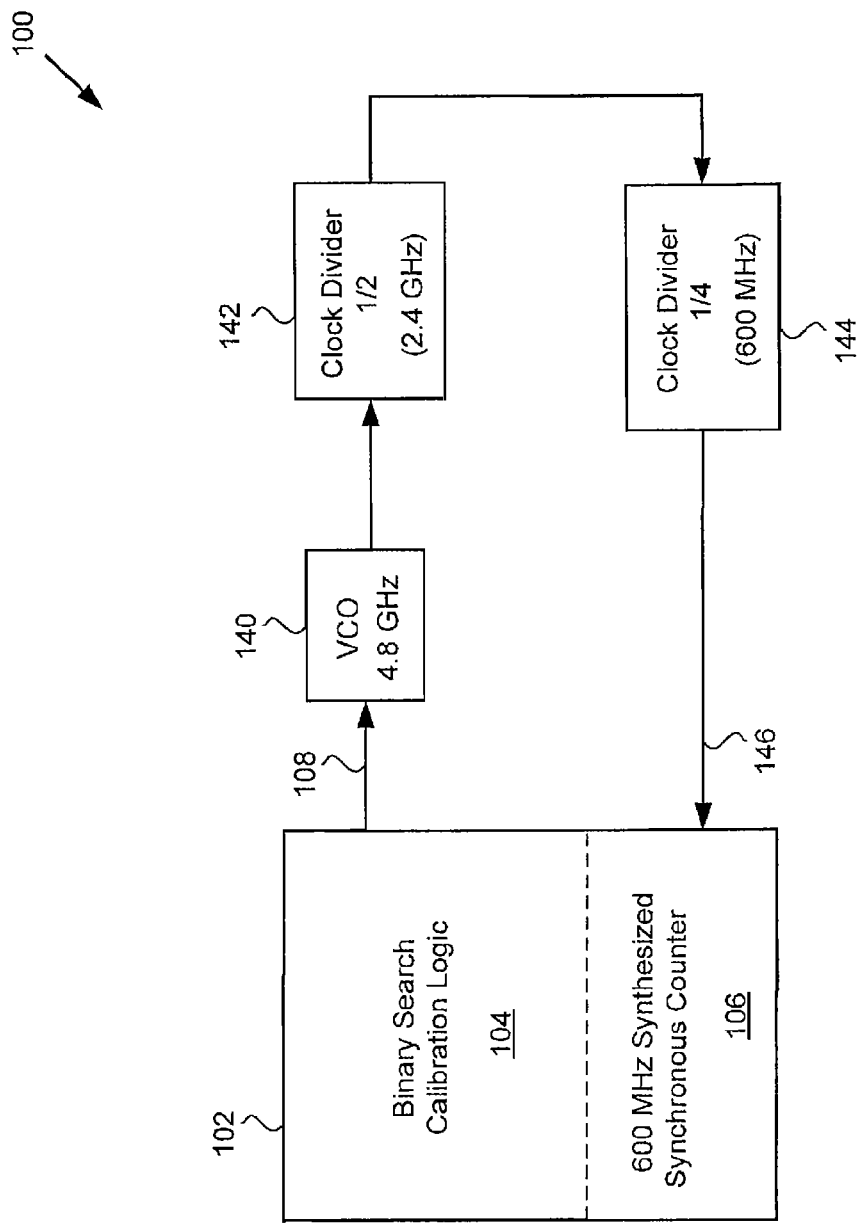
FIG. 1 shows a block diagram of a system including a conventional circuit for use in calibrating a VCO.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 shows a block diagram of a system including a conventional circuit for use in calibrating a voltage controlled oscillator (VCO). System 100 includes conventional calibration circuit 102, VCO 140, ½ clock divider 142, and additional ¼ clock divider 144. As shown in FIG. 1, conventional calibration circuit 102 includes calibration logic block 104 and synchronous counter 106 synthesized with calibration logic block 104. In other words, calibration logic block 104 and synchronous counter 106 are synthesized together in conventional calibration block 102, such that the operation of calibration logic block 104 and synchronous counter 106 can be characterized using a register-transfer level (RTL) description, for example.

As further shown in FIG. 1, conventional calibration circuit 102 is implemented to provide calibration value 108 as an output to VCO 140, and to receive reduced VCO frequency 146 as an input to synchronous counter 106. According to the implementation represented in FIG. 1, which may correspond to a VCO and conventional calibration circuit used in a Bluetooth enabled device, for example, the VCO frequency is approximately 4.8 GHz. The operation of ½ clock divider 142 reduces the frequency of the VCO signal received by ½ clock divider 142 to approximately 2.4 GHz, while the operation of ¼ clock divider 144 further reduces the frequency of reduced VCO frequency 146 to 600 MHz. Reduction of the VCO frequency to 600 MHz is typically necessitated by circuitry internal to synchronous counter 106, such as adder circuitry used to increment synchronous counter 106, for example.

As a specific example of VCO calibration using conventional calibration circuit 102, let us assume that VCO 140 is used to support Bluetooth communications using the seventy-nine (79) Bluetooth channels spanning the frequency range from 2402 MHz to 2480 MHz. In such an implementation, VCO 140 can be understood to operate at approximately twice the Bluetooth communication frequency, that is, at a frequency of approximately 4.8 GHz, as shown in FIG. 1. Calibration of VCO 140 using conventional calibration circuit 102 would typically include using calibration logic block 104 to execute a binary tree search routine to identify an optimum calibration value from among the range of calibration values available for tuning VCO 140. Each calibration value investigated using the binary tree search would typically be applied to VCO 140, followed by evaluation of reduced VCO frequency 146 by synchronous counter 106 operating at 600 MHz.

In a conventional implementation, a calibration value for VCO 140 may include 11-bits of data, for example, and may require 11 search steps for calibration of VCO 140, with each search step including execution of a counting sequence by synchronous counter 106 running at 600 MHz. In other words, calibration of VCO 140 using conventional calibration circuit 102 typically requires numerous binary tree search steps by calibration logic block 104 and the execution of numerous counting sequences by synchronous counter 106 before conventional calibration circuit 102 converges on a suitable calibration value for VCO 140. However, because each search step and counting sequence consumes system power, the iterative binary search approach used by calibration logic block 104 and the relatively low operating frequency mandated by synchronous counter 106 result in undesirably high levels of power consumption during calibration of VCO 140 by conventional calibration circuit 102.

Figure 2:
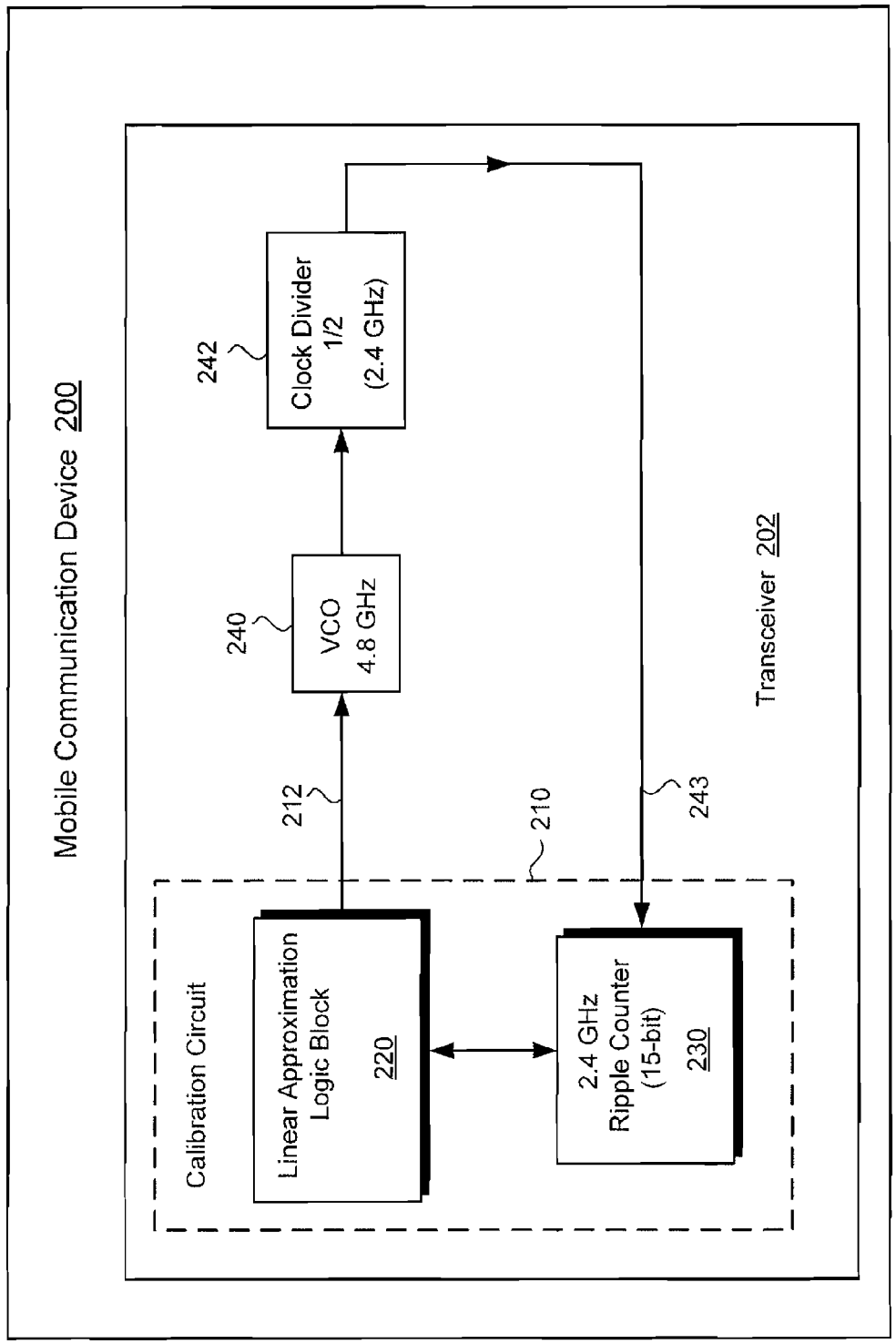
FIG. 2 shows a mobile communication device including an exemplary calibration circuit for VCO calibration.

Referring now to FIG. 2, FIG. 2 shows a mobile communication device including an exemplary calibration circuit for VCO calibration, capable of overcoming the drawbacks and deficiencies described above in relation to the conventional art. Mobile communication device 200 includes transceiver 202 including calibration circuit 210, VCO 240, and ½ clock divider 242. Mobile communication device 200 may be a Bluetooth or Bluetooth Low Energy (BLE) device, for example, such that transceiver 202 is configured for use at a Bluetooth frequency, e.g., at a frequency in the range from approximately 2402 MHz to approximately 2480 MHz.

Calibration circuit 210 of mobile communication device 200 includes logic block 220 interactively coupled to counter 230, which may be an asynchronous counter, for example, such as the 15-bit ripple counter operating at 2.4 GHz represented in FIG. 2. Thus, in contrast to conventional calibration circuit 102, in FIG. 1, the counter utilized in the example implementation shown in FIG. 2 is an asynchronous counter and is thus not synthesized with the calibration logic of logic block 220. Calibration circuit 210 is implemented to provide calibration value 212 as an output to VCO 240, and to receive half VCO frequency 243 as an input to asynchronous counter 230.

According to the implementation represented in FIG. 2, the VCO frequency is approximately 4.8 GHz. The operation of ½ clock divider 242 reduces the frequency of the VCO signal received by ½ clock divider 242 from 4.8 GHz to approximately 2.4 GHz, whereupon half VCO frequency 243 is input to asynchronous counter 230. In one implementation, transceiver 202 including calibration circuit 210, VCO 240, and ¼ clock divider 242 may be fabricated as an integrated circuit (IC), for example. It is noted that, in the interest of conceptual clarity, only selected features of transceiver 202 are shown in FIG. 2. Other features typically found in a more modern communications transceiver, such as a digital baseband block, power amplifier, and duplexer, for example, are not expressly shown in FIG. 2, but are well known in the art.

Mobile communication device 200 including calibration circuit 210 overcomes the drawbacks and deficiencies of conventional designs through configuration of logic block 220 to estimate a calibration value for tuning VCO 240 to a desired frequency based on a linear approximation of the frequency response of VCO 240 across a frequency range including the desired frequency. Calibration circuit 210 can then utilize the results of as little as a single counting sequence executed by counter 230 to determine a tuned calibration value for producing the desired frequency from VCO 240.

Figure 3:
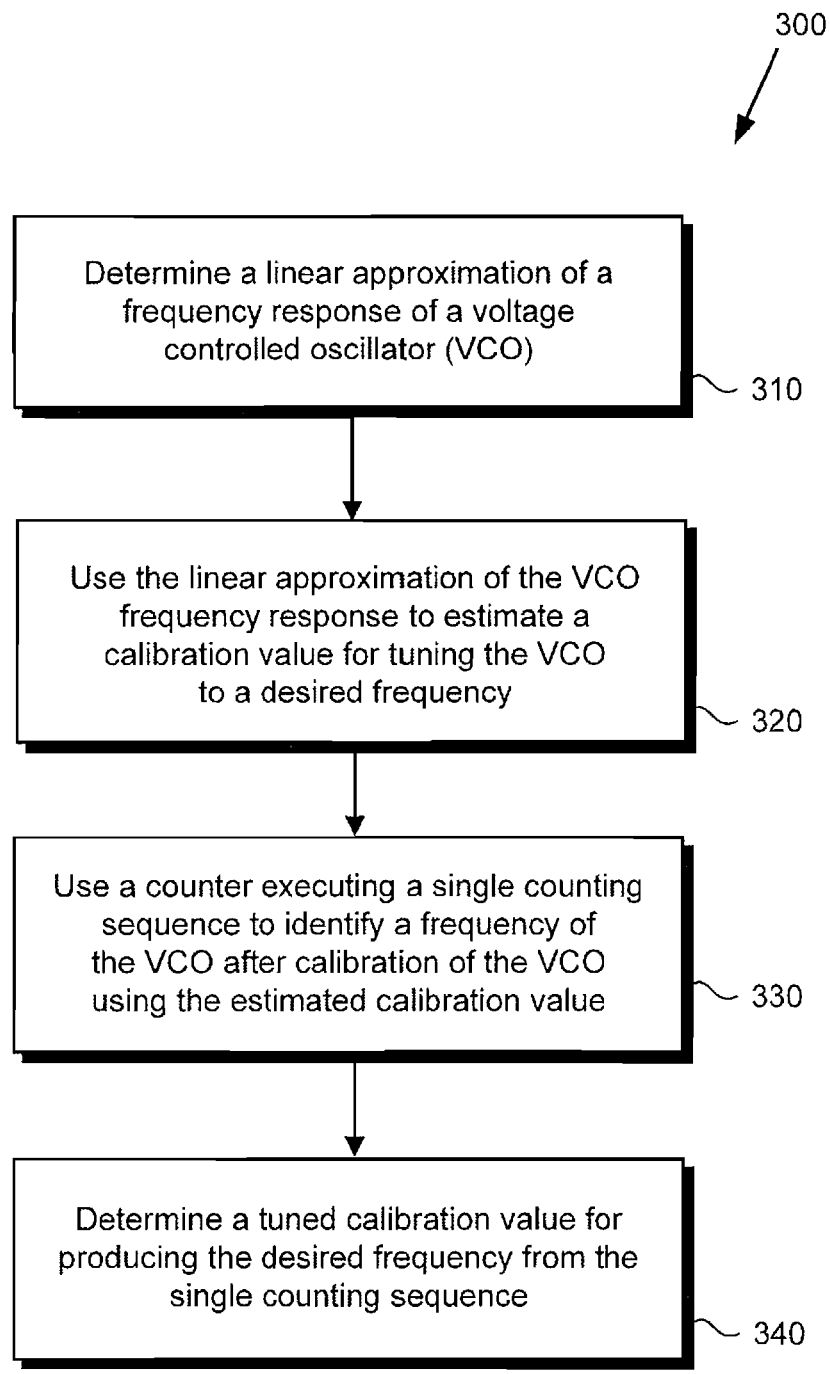
FIG. 3 shows a flowchart presenting an exemplary method for providing VCO calibration.
Figure 4:
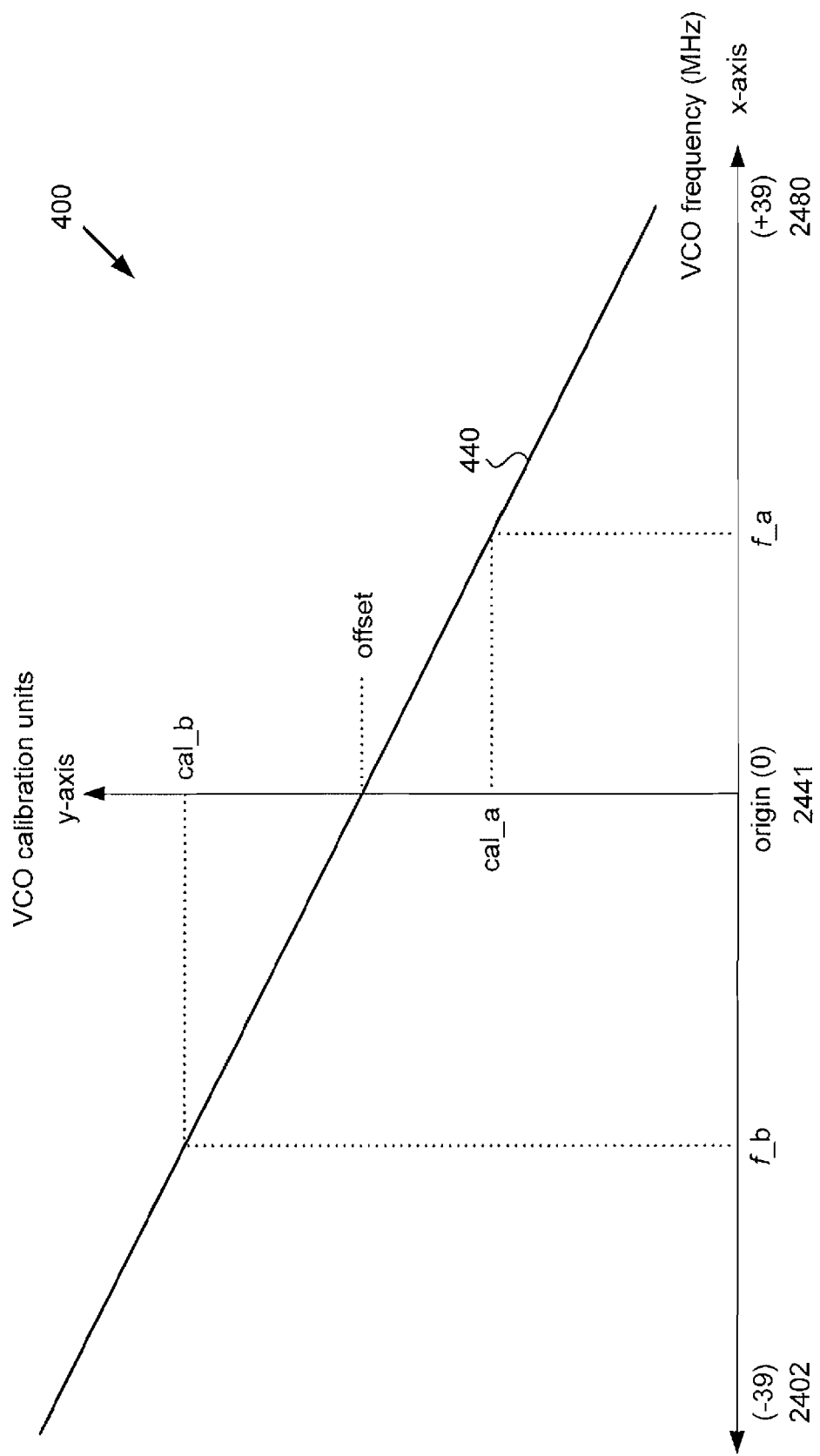
FIG. 4 shows a graph of an example frequency response of a VCO across a Bluetooth range of frequencies.
Figure 5:
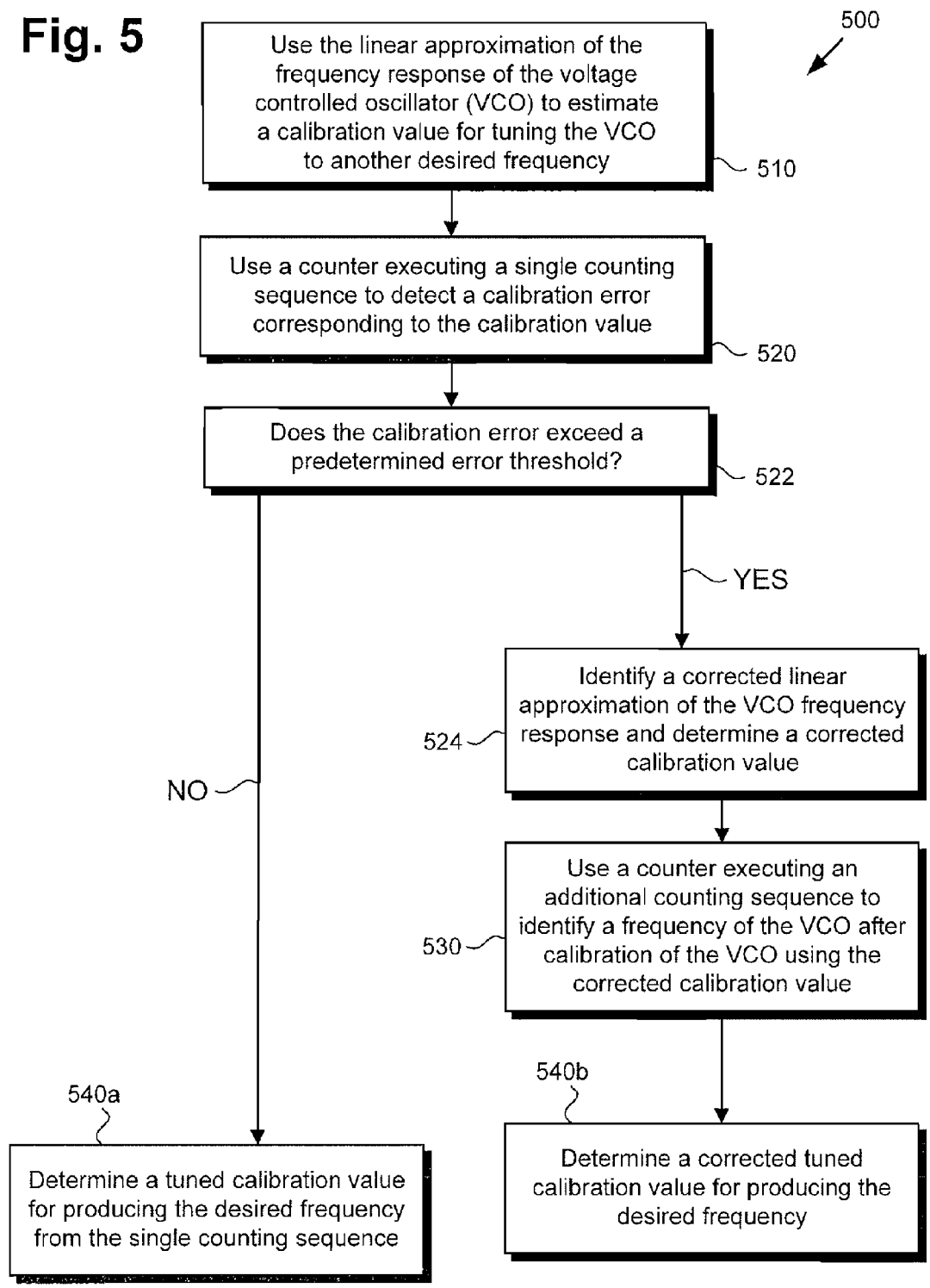
FIG. 5 shows a flowchart presenting an exemplary method for providing VCO calibration correction.

The operation of calibration circuit 210, in FIG. 2, will now be further described by reference to FIGS. 3, 4, and 5. FIG. 3 shows flowchart 300, which describes an exemplary method for providing VCO calibration, while FIG. 4 shows a graph of an example frequency response of a VCO across a Bluetooth range of frequencies. FIG. 5 shows flowchart 500 presenting an exemplary method for providing VCO calibration correction. With respect to the methods outlined in FIGS. 3 and 5, it is noted that certain details and features have been left out of respective flowcharts 300 and 500 that are apparent to a person of ordinary skill in the art.

Referring first to flowchart 300, in FIG. 3, with additional reference to FIGS. 2 and 4, flowchart 300 begins when calibration circuit 210 is used to determine a linear approximation of a frequency response of VCO 240 (310). Determination of the linear approximation of the frequency response of VCO 240 would typically be required only during initialization of mobile communication device 200, such as upon its first use after acquisition by a user, or following replacement of a battery serving as the power supply for mobile communication device 200 (battery not shown in FIG. 2). As a result, it is contemplated that determination of the linear frequency response approximation for VCO 240 will be a relatively infrequent event. Consequently, most of the calibration operations performed by calibration circuit 210 will utilize an already determined linear approximation of the frequency response of VCO 240.

Nevertheless, at initialization of mobile communication device 200, or after battery replacement, for example, substantially nothing is known about the frequency response of VCO 240. However, it may be appreciated that for a limited frequency range, such as the frequency range from approximately 2402 MHz to approximately 2480 MHz spanned by the Bluetooth channels, the frequency response of VCO 240 may be assumed to be substantially linear, as shown by linear approximation 440 of graph 400. Thus, a linear approximation of the frequency response of VCO 240, such as linear approximation 440, can be obtained from two measurements relating frequency and calibration value.

Graph 400 shows half the VCO frequency (in MHz), e.g., corresponding to half VCO frequency 243, in FIG. 2, along the x-axis in FIG. 4. Frequencies in the Bluetooth frequency range of frequencies from 2402 MHz to 2480 MHz are shown in FIG. 4. Moreover, as an aid to the determination process, the origin of the x-axis of graph 400 has been set at a frequency of 2441 MHz, e.g., in the center of the Bluetooth frequency range. Consequently, the high edge Bluetooth frequency of 2480 MHz is designated as +39, and the low edge Bluetooth frequency of 2402 is designated as −39. It is noted that, although the present discussion is directed to the Bluetooth frequency range for exemplary purposes, the concepts disclosed herein are more generally applicable to any range of frequencies for which a linear approximation of VCO frequency response can yield useful information.

In the present instance, linear approximation 440 can be determined using predetermined calibration values "cal_a" and "cal_b", and running counter 230, in FIG. 2, to measure the frequency count resulting, respectively, after calibration of VCO 240 with calibration values cal_a and cal_b. The values for cal_a and cal_b can be stored in respective registers of logic block 220, for example. Linear approximation 440 can be determined through characterization of a slope "m", and an offset (also $y_{offset}$) at which linear approximation 440 crosses the y-axis. Thus, determination of linear approximation 440 may be performed by identifying the slope and offset according to respective Equations 1 and 2:

$$\text{Slope: } m = (cal\_a - cal\_b)/(f\_a - f\_b); \quad \text{(Equation 1)}$$

$$\text{Offset: } y_{offset} = cal\_a - m(f\_a - 2441); \quad \text{(Equation 2)}$$

Determination of linear approximation 440 may be performed by logic block 220 of calibration circuit 210. Moreover, that determination can be performed using just two counting sequences by counter 230, e.g., one following calibration of VCO 240 using calibration value cal_a to measure, f_a, and a second following calibration of VCO 240 using calibration value cal_b to measure f_b.

Flowchart 300 continues with logic block 220 using linear approximation 440 to estimate a calibration value for tuning VCO 240 to a desired frequency (320). According to the implementation represented by graph 400, a desired frequency may correspond to any Bluetooth frequency in the range from 2402 MHz to 2480 MHz. For the purposes of estimating a calibration value for producing the desired frequency, such a desired frequency may be represented by a normalized value consistent with identification of 2441 MHz as the frequency origin of graph 400. Consequently, logic block 210 can estimate a calibration value for producing a desired frequency from the slope determined by Equation 1, the offset determined by Equation 2, and a normalized frequency value ($f_0$) corresponding to the desired frequency, according to Equation 3:

$$\text{Estimated Calibration Value: } cal\_est = y_{offset} + m * f_0; \quad \text{(Equation 3)}$$

Flowchart 300 continues when counter 230 executes a single counting sequence to identify the frequency produced by VCO 240 after calibration of VCO 240 using the estimated calibration value of Equation 3 (330). For example, 2.4 GHz ripple counter 230 can be used to obtain a frequency count from half VCO frequency 243 enabling identification of the frequency produced by VCO 240 after calibration using cal_est. For the purposes of the present discussion, half VCO frequency 243 corresponding to the VCO frequency identified after calibration of VCO 240 using the estimated calibration value cal_est will be designated as "f_c"

Flowchart 300 concludes when calibration circuit 210 is used to determine a tuned calibration value for producing the desired frequency from the single counting sequence executed by counter 230 after calibration of VCO 240 using the estimated calibration value (340). Such a determination may include identification of a residual value "r" corresponding to a calibration error detected from the single counting sequence executed by counter 230 to obtain f_c. The residual value, or calibration error, is given by Equation 4:

$$\text{Calibration Error: } r = (f\_c - 2441) - f_0; \quad \text{(Equation 4)}$$

Under stable operating conditions, such as relatively constant temperature, for example, it is anticipated that linear approximation 440 will provide a substantially accurate model for the frequency response of VCO 240 subsequent to initialization of mobile communication device 200, in FIG. 2. Consequently, the magnitude of the calibration error "r" may be expected to be small, e.g., less than a predetermined allowable error threshold. In that instance, the tuned calibration value may be determined by logic block 220 of calibration circuit 210 according to Equation 5, in which the calibration error is utilized in determining the tuned calibration value:

$$\text{Tuned Calibration Value: } cal\_t = cal\_est - m*r; \quad \text{(Equation 5)}$$

Thus, flowchart 300 outlines a method for VCO calibration enabling calibration of VCO 240 using linear approximation 440, in FIG. 4, and the result of a single counting sequence by counter 230 of calibration circuit 210. That is in marked contrast to the conventional art represented in FIG. 1, wherein calibration of VCO 140 typically requires the execution of numerous counting sequences by synchronous counter 106 to evaluate the progress of the binary tree search routine performed by calibration logic block 104. Moreover, counter 230 of calibration circuit 210, which may be an asynchronous counter, for example, is implemented in FIG. 2 to run four times faster than synchronous counter 106 of conventional calibration circuit 102. Consequently, the features disclosed by Applicants herein provide significant advantages over the conventional art, such as substantially increased counting speed, and substantially faster convergence to a desired VCO frequency, for example, thereby reducing the power consumption associated with VCO calibration.

Moving to FIG. 5, FIG. 5 shows flowchart 500 presenting an exemplary method for providing VCO calibration correction. Referring to flowchart 500 with continued reference to FIGS. 2 and 4, flowchart 500 may be seen to correspond to those relatively infrequent occasions when temperature instability, for example, may cause linear approximation 440 to shift on graph 400 and/or exhibit a change in slope, after an initial calibration sequence identifying the slope and offset of linear approximation 440 according to Equations 1 and 2 above. Flowchart 500 begins when calibration circuit 210 uses linear approximation 440, which is presumptively accurate, to estimate a subsequent calibration value for tuning VCO 240 to another desired frequency (510). Determination of an estimated calibration value after linear approximation 440 has been characterized may be seen to correspond to use of Equation 3 above, for a normalized frequency value ($f_{ON}$) corresponding to the other desired frequency:

$$\text{Estimated Calibration Value: } cal\_est_N = y(\text{offset}) + m*f_{ON}; \quad \text{(Equation } 3_N)$$

Flowchart 500 continues with logic block 220 detecting a calibration error corresponding to the calibration value estimate from a single counting sequence executed by counter 230 (520). It is noted that after determination of a first tuned calibration value using Equation 5, subsequent calibrations may occur hundreds or as many as a thousand times per second, for example. During those subsequent calibrations, the slope and offset values initially provided by Equations 1 and 2 are typically accurate, and only calculations analogous to Equations 3, 4, and 5 normally need to be performed, thereby enabling a fast calibration of VCO 240 using only a single counting sequence by counter 230. The calibration error "$r_N$" corresponding to respective subsequent estimated calibration values may be detected by reapplication of Equation 4 using the frequency count measured by counter 230 after calibration of VCO 240 using the subsequent estimated calibration value cal_est$_N$, e.g., for subsequent calibration errors:

$$r_N = (f\_c_N - 2441) - f_{ON}; \quad \text{(Equation } 4_N)$$

Flowchart 500 then includes a determination, by logic block 220, as to whether the calibration error exceeds a predetermined error threshold (522). As previously discussed, it is anticipated that the magnitude of the calibration error will fall below the error threshold on most occasions. In those instances, flowchart 500 concludes when calibration circuit 220 is used to determine a tuned calibration value for producing the desired frequency from the single counting sequence executed by the counter after calibration of VCO 240 using the estimated calibration value cal_est$_N$ (540a). For example, as explained above in relation to flowchart 300, the tuned calibration value may be determined by logic block 220 of calibration circuit 210 according to Equation 5 using the estimated calibration value determined by Equation $3_N$ and the calibration error value determined by Equation $4_N$:

$$\text{Tuned Calibration Value: } cal\_t_N = cal\_est_N - m*r_N; \quad \text{(Equation } 5_N)$$

However, in those instances in which the calibration error exceeds the predetermined error threshold, calibration circuit 210 can be configured to identify a corrected linear approximation of the frequency response of VCO 240 and to determine a corrected estimate of the calibration value using the corrected linear approximation (524). A corrected linear approximation requires a corrected slope and/or corrected offset. A corrected slope can be determined, for example, using the known point (f_c$_N$, cal_est$_N$) on graph 400 of FIG. 4, and determining a second point.

A second point needed for determination of the corrected slope can be identified using an edge calibration value stored in a register of logic block 220, for example, and the result of a first additional counting sequence executed by counter 230 to identify the frequency produced by VCO 240 after calibration of VCO 240 using the edge calibration value. An edge calibration value may correspond to an extremum calibration value relative to the range of calibration values usable by calibration circuit 210. In other words, the edge calibration value may be substantially the lowest or substantially the highest calibration value usable by calibration circuit 210, corresponding to the edge frequencies of 2402 MHz and 2480 MHz shown in FIG. 4. For example, where the normalized frequency value ($f_{ON}$) corresponding to the desired frequency has a positive value (e.g., 0<$f_{ON}$<+39), the lowest usable calibration value (e.g., corresponding to edge frequency 2402 MHz) may be used as the edge calibration value, while, conversely, the highest usable calibration value (e.g., corresponding to edge frequency 2480 MHz) would be used as the edge calibration value when the normalized frequency value has a negative value (e.g., $0 > f_{0N} > -39$). Determination of the corrected slope and offset may be performed using equations analogous to Equations 1 and 2 above. An equation analogous to Equations 3 and $3_N$ may then be used to determine a corrected estimated calibration value.

Flowchart 500 continues when counter 230 executes a second additional counting sequence to identify the frequency produced by VCO 240 after calibration of VCO 240 using the corrected estimated calibration value (530), and concludes when calibration circuit 210 is used to determine a corrected tuned calibration value for producing the desired frequency from the two additional counting sequences executed by counter 230 (540b). As explained above, such a determination may include identification of a calibration error given by an equation analogous to Equation 4, and use of that error value in an equation analogous to Equation 5 for determination of the corrected tuned calibration value. Thus, flowchart 500 outlines a method for VCO calibration advantageously enabling calibration correction using a corrected linear approximation and the result of two additional counting sequences executed by counter 230 after detection of a calibration error.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the spirit and the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

What is claimed is:

1. A method for use by a calibration circuit including a logic block and a counter for providing a voltage controlled oscillator (VCO) calibration, the method comprising:
   determining, by the logic block, a linear approximation of a frequency response of the VCO using at least two predetermined calibration values;
   estimating, by the logic block, a calibration value for a tuning of the VCO to a desired frequency using the linear approximation of the frequency response of the VCO;
   identifying, by the counter executing a counting sequence, a frequency of the VCO after the tuning of the VCO using the calibration value; and
   determining, by the calibration circuit, a tuned calibration value for producing the desired frequency from the counting sequence.

2. The method of claim 1, wherein the counter executing the counting sequence executes a single counting sequence.

3. The method of claim 1, wherein the counter executing the counting sequence executes two counting sequences.

4. The method of claim 1, further comprising:
   detecting, by the logic block, a calibration error; and
   utilizing the calibration error in determining the tuned calibration value.

5. The method of claim 1, further comprising detecting, by the logic block, a calibration error after the determining of the tuned calibration value, wherein the calibration circuit is configured to determine a corrected tuned calibration value for producing the desired frequency from two additional counting sequences executed by the counter.

6. The method of claim 1, wherein the counter is an asynchronous counter.

7. The method of claim 1, wherein the desired frequency is a Bluetooth frequency.

8. A calibration circuit providing a voltage controlled oscillator (VCO) calibration, the calibration circuit comprising:
   a logic block configured to estimate a calibration value for a tuning of the VCO to a desired frequency, wherein the logic block is configured to utilize a linear approximation of a frequency response of the VCO using at least two predetermined calibration values to estimate the calibration value;
   a counter configured to execute a single counting sequence to identify a frequency of the VCO after the tuning of the VCO using the calibration value;
   wherein the calibration circuit is configured to determine a tuned calibration value for producing the desired frequency from the single counting sequence.

9. The calibration circuit of claim 8, wherein the logic block is further configured to determine a linear approximation of a frequency response of the VCO before estimating the calibration value.

10. The calibration circuit of claim 9, wherein the linear approximation of the frequency response of the VCO is determined using two counting sequences by the counter.

11. The calibration circuit of claim 8, wherein:
    the logic block is further configured to detect a calibration error; and
    the calibration circuit is configured to utilize the calibration error in determining the tuned calibration value.

12. The calibration circuit of claim 8, wherein:
    the logic block is further configured to detect a calibration error after determining the tuned calibration value; and
    the calibration circuit is configured to determine a corrected tuned calibration value for producing the desired frequency from two additional counting sequences executed by the counter.

13. The calibration circuit of claim 8, wherein the counter is an asynchronous counter.

14. The calibration circuit of claim 8, wherein the desired frequency is a Bluetooth frequency.

15. A mobile communication device comprising:
    a transceiver including a voltage controlled oscillator (VCO); and
    a calibration circuit for calibrating the VCO, the calibration circuit including:
      a logic block configured to estimate a calibration value for a tuning of the VCO to a desired frequency, wherein the logic block is further configured to utilize a linear approximation of a frequency response of the VCO using at least two predetermined calibration values prior to estimating the calibration value; and
      an asynchronous counter configured to execute a counting sequence to identify a frequency of the VCO after the tuning of the VCO using the calibration value;
    wherein the calibration circuit is configured to determine a tuned calibration value for producing the desired frequency from the counting sequence.

16. The mobile communication device of claim 15, wherein the counter executing the counting sequence executes a single counting sequence.

17. The mobile communication device of claim 15, wherein the transceiver is configured for use at Bluetooth frequencies.

\* \* \* \* \*